United States Patent [19]
Bach et al.

[11] Patent Number: 5,654,895
[45] Date of Patent: Aug. 5, 1997

[54] PROCESS MONITOR USIG IMPEDANCE CONTROLLED I/O CONTROLLER

[75] Inventors: Randall Bach, Stillwater; Shuran Wei, St. Paul, both of Minn.

[73] Assignee: LSI Logic Corporation, Milpitas, Calif.

[21] Appl. No.: 627,622

[22] Filed: Apr. 4, 1996

[51] Int. Cl.$^6$ ............ G01R 27/00; G01R 31/26; H01L 21/00; H01L 21/66
[52] U.S. Cl. ............ 364/482; 364/468.28; 438/18
[58] Field of Search ............ 364/482, 552, 364/569, 490, 468.01, 468.28; 204/298.32; 437/7, 8; 371/22.1, 25.1; 326/16; 216/59, 61

[56] References Cited

U.S. PATENT DOCUMENTS

| | | | |
|---|---|---|---|
| 4,743,841 | 5/1988 | Takeuchi | 324/73 R |
| 4,970,454 | 11/1990 | Stambaugh et al. | 324/73.1 |
| 5,055,715 | 10/1991 | Inaba | 307/443 |
| 5,068,547 | 11/1991 | Gascoyne | 307/443 |
| 5,095,267 | 3/1992 | Merrill et al. | 324/158 R |
| 5,444,637 | 8/1995 | Smesny et al. | 364/556 |
| 5,486,786 | 1/1996 | Lee | 327/378 |

*Primary Examiner*—Emanuel T. Voeltz
*Assistant Examiner*—Tony M. Cole
*Attorney, Agent, or Firm*—Westman, Champlin & Kelly, P.A.

[57] ABSTRACT

A process monitor and a method of using the same to determine the relative strength of a semiconductor fabrication process are disclosed. An impedance control output from an impedance controller circuit located on a semiconductor device is retrieved. Based upon a value of the retrieved impedance control output, the relative strength of the semiconductor fabrication process used to fabricate the semiconductor device is determined.

15 Claims, 3 Drawing Sheets

1

PROCESS MONITOR USIG IMPEDANCE CONTROLLED I/O CONTROLLER

BACKGROUND OF THE INVENTION

The present invention relates generally to process monitors for evaluating the relative strength of a semiconductor device fabrication process, and more particularly, to a new process monitor which utilizes an existing impedance controller on the semiconductor device as the process monitor.

Monitoring silicon fabrication process statistics is very important for semiconductor manufacturers to ensure the quality of the integrated chip or semiconductor devices produced and to provide better control of the semiconductor fabrication processes used. Process deviations during fabrication result in the production of semiconductor devices which exhibit a wide range of characteristics. If a particular device exhibits "strong" characteristics (such as low output impedances, high drive currents and faster speed), the process used to fabricate the particular semiconductor device will be referred to as a "strong process". On the other hand, devices exhibiting "weak" characteristics (such as high output impedances, low drive currents and slower speeds) are frequently described as being fabricated using a "weak process".

Process monitor circuitry is used by manufacturers of semiconductor devices to help identify the relative strengths and weaknesses of the devices produced, and thus of the processes used to fabricate the devices. Conventionally, dedicated process monitor circuitry is included on the silicon used to fabricate the semiconductor device, and includes a long chain of linked delay elements. The delay of an electrical signal across the dedicated process monitor circuitry is measured and compared with the results provided by other process monitors from other semiconductor devices, or with data from computer simulations. Based upon the results of the comparison, the manufacturer can determine whether the process used to manufacture the particular semiconductor device was fast or slow as compared to the nominal process results.

Conventional process monitors and methods of using the same introduce a number of problems and disadvantages. For example, conventional process monitor circuitry is used solely for the purpose of monitoring the strength of the device and of the process. Since there are no other intended uses for the circuitry, inclusion of the process monitor on the device is inefficient use of silicon area. Further, to increase measurability and to guarantee proper correlation with the performance of real circuits, a large number of delay elements must typically be included in the process monitor circuitry in order to obtain at least some minimum delay. As process advances are made, the delay introduced by each delay element has been reduced such that even longer chains of delay elements have to be used to obtain the minimum necessary delay. This further increases the silicon area required for the process monitor. In general, an undesirable trend has arisen: the faster the process becomes, the bigger the process monitor needed.

Therefore, there is a need for an improved process monitor which overcomes the deficiencies and limitations of conventional process monitors and methods of using the same.

SUMMARY OF THE INVENTION

The present invention is based, in part, upon the recognition that utilizing an existing impedance controller on a semiconductor device or integrated chip as a process monitor eliminates the waste of silicon area normally required for prior art dedicated process monitor circuitry. This in turn can reduce the size of semiconductor devices, as well as the costs and complexity of fabricating semiconductor devices. Further, utilizing an existing impedance controller circuit on the semiconductor device as the process monitor provides a solution to the undesirable trend in the prior art of requiring larger process monitors for faster processes.

The present invention provides a process monitor and a method of using the same to determine the relative strength of a semiconductor fabrication process while minimizing or eliminating certain disadvantages associated with conventional process monitors. An impedance control output from an impedance controller circuit located on a semiconductor device is retrieved. Based upon a value of the retrieved impedance control output, the relative strength of the semiconductor fabrication process used to fabricate the semiconductor device is determined.

DETAILED DESCRIPTION OF THE PREFERRED EMBODIMENTS

The present invention is based, in part, upon the recognition that utilizing an existing impedance controller on an integrated chip semiconductor device as the process monitor eliminates the waste of silicon area normally required for prior art dedicated process monitor circuitry. This in turn provides advantages such as reduced size of integrated chips, as well as reduced costs and complexity of fabricating integrated chip semiconductor devices. Further, utilizing an existing impedance controller circuit on the integrated chip semiconductor device as the process monitor provides a solution to the undesirable trend in the prior art of requiring larger process monitors for faster processes.

Process monitor 10 of the present invention includes impedance controller circuit 12 located on the integrated chip or semiconductor device and off-chip data retrieval and/or storage device 14. Although preferred embodiments of impedance controller circuit 12 are discussed below in detail, impedance controller circuit 12 can be any of a variety of circuits which provide an impedance control output to input/output (I/O) drivers on the semiconductor device to correct for changes in at least one of the following: (1) the semiconductor fabrication process used to fabricate the device; (2) the operating voltage; and (3) the operating temperature. Device 14 can be any of a variety of devices well known in the art for receiving and storing data for analysis and reference. For example, device 14 can be a personal computer (PC) or other microprocessor-based devices adapted for retrieving data from circuit 12.

Figure 1:
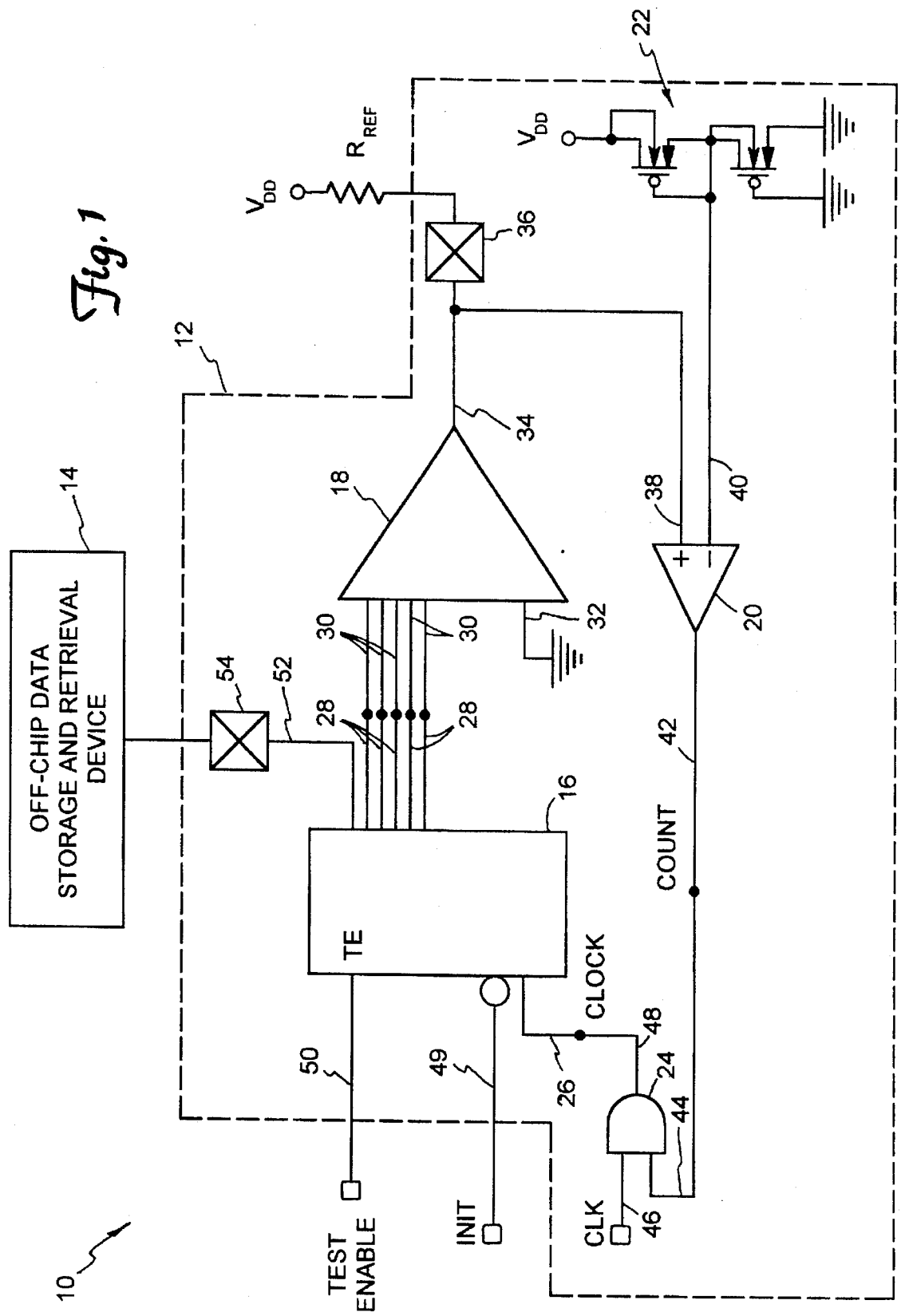
FIG. 1 is a schematic diagram illustrating an improved process monitor in accordance with preferred embodiments of the present invention.

In the preferred embodiment illustrated in FIG. 1, impedance controller 12 includes counter 16, buffer 18, differential amplifier 20, voltage divider 22 and logical AND gate 24.

Counter 16 is of the type which, in response to clock cycles on clock signal input 26, adjusts a binary code provided on counter output lines 28. Counter output lines 28 are coupled to impedance control input lines 30 of buffer 18 for controlling the impedance of buffer output 34. Buffer 18 is of the type well known in the art which includes impedance control input lines 30 for controlling the output impedance of the buffer, and which has a data-type buffer input 32 and a buffer output 34. The output voltage of buffer 18 at output 34 is a function of the voltage at buffer input 32. Because buffer input 32 is coupled to ground, the output voltage of buffer output 34 will be driven or biased toward the low logic level. As illustrated in FIG. 1, with buffer input 32 tied to ground, impedance controller 12 is configured so as to control the impedances of N-channel type drivers on the semiconductor device. Thus, this configuration is also adapted for monitoring the strength of the N-channel fabrication process.

It must be noted that typically a device will include a separate P-channel impedance controller circuit identical or similar to controller 12, but with buffer input 32 coupled to a high logic level voltage. This P-channel type impedance controller is used in accordance with the present invention to monitor the strength of the P-channel process.

The value of the binary code provided by counter 16 on output lines 28 controls the output impedance of buffer output 34 and is used to increase or decrease the output impedance to compensate or correct for changes caused by variations in the manufacturing process, the operating voltage and/or the operating temperature. In preferred embodiments, the higher the value of the binary code provided by counter 16 to inputs 30 of buffer 18, the more the output impedance of buffer 18 is decreased to achieve some desired level. In the context of some preferred embodiments of the present invention, a high uncompensated buffer output impedance is indicative of a weak device, and thus of a weak manufacturing or fabrication process. Generally, "weak" devices have high impedances and thus lower drive currents and slower speeds, while "strong" semiconductor devices have lower impedances and thus higher drive currents and faster speeds. For the purposes of the present invention, "weak" devices are a result of a "weak" fabrication process, while "strong" devices are a result of a "strong" fabrication process.

Output 34 of buffer 18 is connected to an off-chip reference impedance or resistor $R_{REF}$ through pad or external connection 36. Reference resistor $R_{REF}$ is coupled between pad 36 and supply voltage $V_{DD}$. Thus, the actual output voltage at buffer output 34 will be determined by a voltage division between the output impedance of buffer 18 and the reference impedance $R_{REF}$. Ideally, the output impedance of buffer 18 is substantially equal to reference impedance $R_{REF}$ such that, with the output of buffer 18 biased toward the lower logic level, the actual output voltage at output 34 is approximately one-half of supply voltage $V_{DD}$.

Differential amplifier 20, voltage divider 22 and logical AND gate 24 together function as a feedback circuit for controlling the adjustment of the binary code such that the output impedance of buffer 18 is maintained substantially equal to reference impedance $R_{REF}$. As shown, voltage divider 22 includes two P-channel transistors configured to provide a voltage equal to one-half of supply voltage $V_{DD}$ to negative input 40 of differential amplifier 20. It must be noted that the reference voltage provided by voltage divider 22 can be provided using a variety of other circuits, including a resistive network type voltage divider. Positive input 38 of differential amplifier 20 is coupled to output 34 of buffer 18. As long as the output impedance of buffer 18 is greater than the reference impedance $R_{REF}$, the voltage at positive input 38 of differential amplifier 20 will be greater than the voltage at negative input 40. Therefore, while the output impedance of buffer 18 remains larger than reference impedance $R_{REF}$, output 42 of differential amplifier 20 will remain at the high logic level. The output of amplifier 20 is also designated in FIG. 1 as the COUNT signal.

Output 42 of differential amplifier 20 is coupled to input 44 of logical AND gate 24. Input 46 of logical AND gate 24 is coupled to a first or reference clock signal CLK. As long as the output of differential amplifier 20 remains at the high logic level (i.e., COUNT remains high), the output signal designated CLOCK at output 48 of logical AND gate 24 will be the same as the reference clock signal CLK. Since output 48 of logical AND gate 24 is coupled to clock signal input 26 of counter 16, counter 16 adjusts the binary code provided at output lines 28 during the cycles of clock signal CLOCK.

In operation as an impedance controller, circuit 12 operates during a compensation cycle as follows. First, counter 16 of impedance controller 12 is initialized with INIT input 49, which clears the counter (provides a binary code at output lines 28 having a value of 0), and thus puts the output impedance of buffer 18 at its highest impedance state. In the highest impedance state, the output impedance of buffer 18 will be greater than reference impedance $R_{REF}$ (typically 50 ohms), and thus the voltage at positive input 38 of differential amplifier 20 will be greater than the voltage at negative input 40. This causes signal COUNT at output 42 of differential amplifier 20 to remain at the high logic level, resulting in reference clock signal CLK being gated through to counter 16. After each transition of clock signal CLK (and thus of clock signal CLOCK), the counter output is incremented by a value of 1, which reduces the output impedance of buffer 18. This in turn reduces the voltage at input 38 of differential amplifier 20. As long as the voltage at input 38 is larger than one-half of supply voltage $V_{DD}$, counter 16 will continue to increment, thus reducing the driver impedance at each step. Ultimately, when the output impedance of buffer 18 is substantially equal to reference impedance $R_{REF}$, the voltage at input 38 of differential amplifier 20 becomes equal to or less than one-half of supply voltage $V_{DD}$. This causes COUNT to transition to the low logic level and blocks clock signal CLK from being gated through to counter 16. Thus, with clock signal CLOCK maintained at a low logic level, the binary code provided by counter 16 on output lines 28 is frozen at the value which caused the output impedance of buffer 18 to be substantially equal to reference impedance $R_{REF}$.

Since the binary code provided by counter 16 is frozen at the corresponding counter value when the voltage at input 38 of differential amplifier 20 becomes equal to $V_{DD}/2$, the output impedance of buffer 18 will be maintained until counter 16 is again initialized and the procedure is repeated. If the voltage or temperature has changed since the last sequence, the binary code will be frozen at a different value than during previous cycles, but always at the value which causes the output impedance of buffer 18 to equal the reference impedance $R_{REF}$ at the particular voltage and temperature. Since reference buffer 18 is identical to other logic buffers or drivers throughout the semiconductor device, the binary code from counter 16 can be distributed globally to all N-channel drivers on the semiconductor device to maintain their drive impedance at the desired level.

As discussed above, impedance controller 12 illustrated in FIG. 1 is configured as an impedance controller for N-channel semiconductor devices fabricated using an N-channel fabrication process. Impedance controllers for P-channel semiconductor devices fabricated using P-channel fabrication processes can be identical to controller 12 with two exceptions. In a P-channel impedance controller, input 32 of buffer 18 is coupled to a reference voltage so that this input is maintained at a high logic level, instead of being maintained at a low logic level as is the case with the N-channel impedance controller illustrated in FIG. 1. Also, reference resistor $R_{REF}$ is tied to ground for a P-channel impedance controller. This biases the output voltage of buffer 18 toward a high logic level as well. However, in other respects, N-channel and P-channel impedance controllers can function the same. Because of the similarities between N-channel and P-channel impedance controllers and in order to simplify the discussion, a P-channel semiconductor device impedance controller is not specifically illustrated. Nevertheless, it must be understood that many integrated chip semiconductor devices fabricated using both P-channel and N-channel fabrication processes will include both an N-channel driver impedance controller and a P-channel driver impedance controller.

The present invention is based in part upon the recognition that the binary code provided by counter 16 is also indicative of the relative strength of the process used to fabricate the semiconductor device. If the temperature and voltage are held at predetermined levels during operation of impedance controller 12, the binary code provided by counter 16 is indicative of where in the normal distribution the process used to fabricate the particular semiconductor device resides. Data storage and retrieval device 14 of process monitor 10 can be used to retrieve the binary code from counter 16 for use in determining the relative strength of the semiconductor device and of the process. By enabling test enable (TE) input 50 to counter 16, the binary code can be serially shifted, through output 52 of counter 16 and pad or electrical access point 54, to data storage and retrieval device 14.

Figure 2:
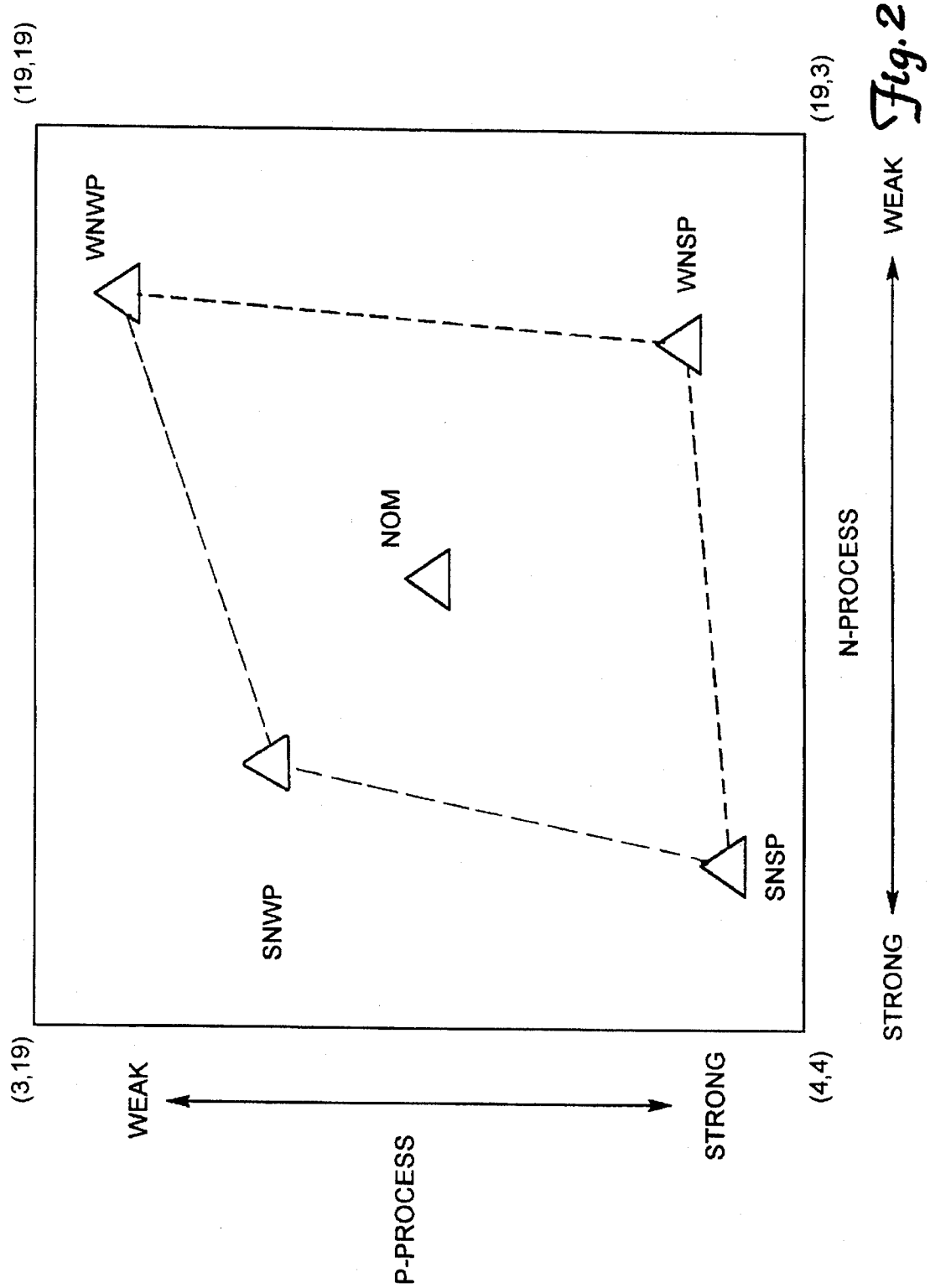
FIG. 2 is a chart illustrating a statistical distribution of process strengths for a semiconductor device fabricated using both a P-channel process and an N-channel process.

FIG. 2 is a chart illustrating various combinations of P-process strengths and N-process strengths which can be used to characterize where in the normal distribution a semiconductor device resides. Four coordinate pairs are illustrated at the corners of the chart to provide a reference. The first number of the coordinate pairs represents the value of the binary code retrieved from the N-channel impedance controller and is thus indicative of the relative strength of the N-channel fabrication process. The second number of the coordinate pairs represents the value of the binary code retrieved from a P-channel impedance controller and is therefore indicative of the relative strength of the P-channel fabrication process.

In the example shown in the chart of FIG. 2, a majority of semiconductor devices tested will fall somewhere within the dotted lines. A nominal or average device will fall near the data point labeled NOM and will have been fabricated using an average strength P-process and an average strength N-process. Thus, both P-channel devices and N-channel devices on the integrated chip will have average impedance characteristics, average drive currents and average speed as compared to other tested devices of the same type fabricated using the same process steps.

Since a low binary code value is indicative of a relatively strong device and process (i.e., low output impedances, high drive currents and correspondingly higher speeds), devices having low N-channel and P-channel binary code values (such as those falling near data point SNSP—"strong N, strong P") will be categorized as being relatively strong devices fabricated using strong N-channel and P-channel processes. Devices with high N-channel and P-channel binary codes (such as those falling near data point WNWP—"weak N, weak P") can be characterized as being relatively weak devices produced using relatively weak N-channel and P-channel fabrication processes. Devices falling near data points SNWP and WNSP are fabricated using a strong N-channel process or a strong P-channel process, but not both.

Figure 3:
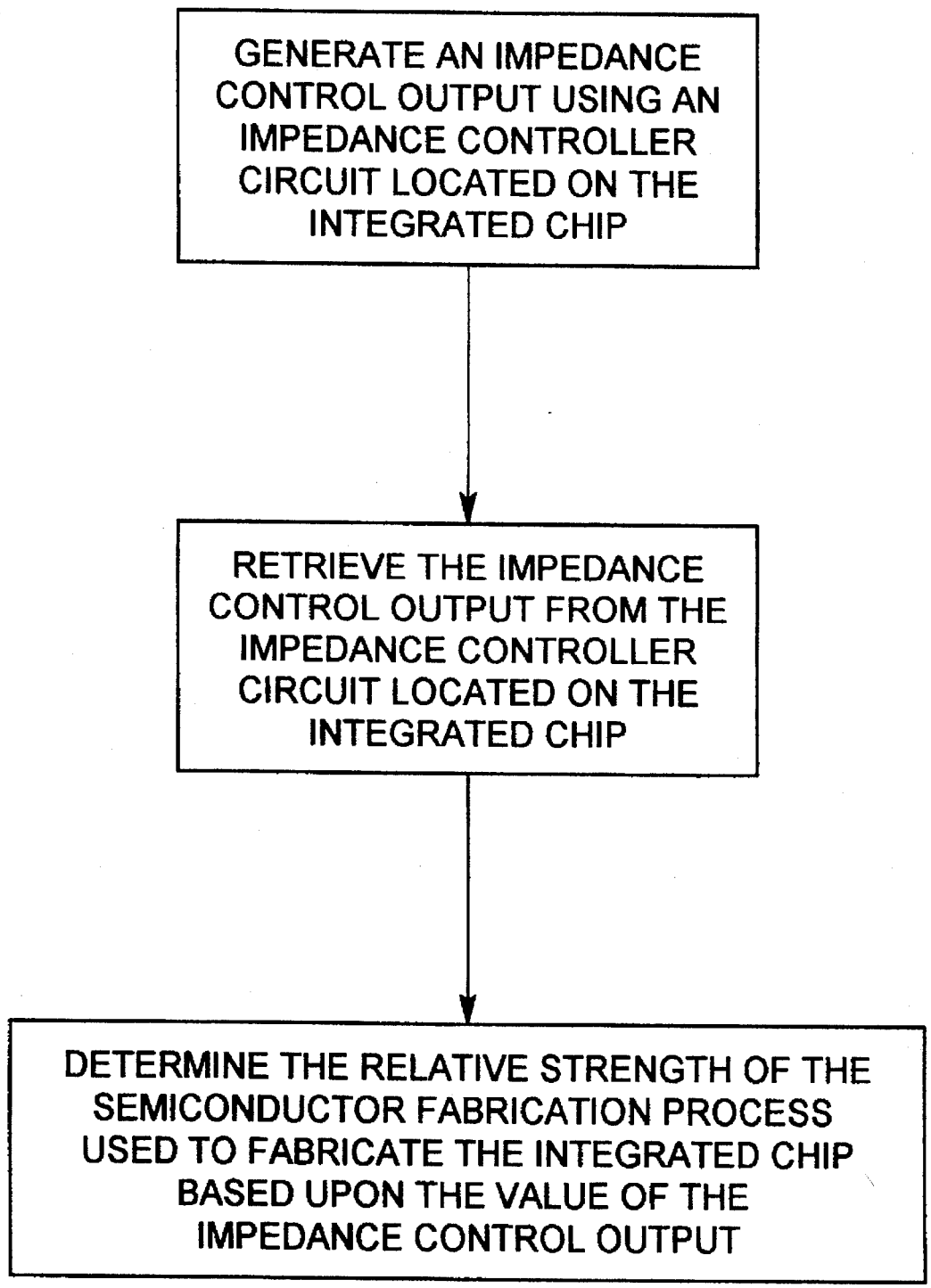
FIG. 3 is a flow diagram illustrating a preferred method of determining the relative strengths of the semiconductor fabrication processes used to fabricate a semiconductor device in accordance with the preferred embodiments of the present invention.

FIG. 3 is a flow diagram illustrating a preferred method of determining a relative strength of the semiconductor fabrication process used to fabricate a semiconductor device. First, an impedance control output is generated using an impedance controller circuit located on the semiconductor device integrated chip. As discussed above, the impedance controller circuit can be of the type used to control the impedances of I/O drivers on the integrated chip to correct for changes in the fabrication process, the operating voltage, and/or the operating temperature. For purposes of providing a meaningful comparison to other integrated chip semiconductor devices fabricated using the same general process, the impedance control output should be generated while the voltage and temperature are maintained at predetermined and consistent levels. Also, as discussed above, in preferred embodiments, the impedance control output is a binary code which can be provided to I/O drivers on the integrated chip. However, in other embodiments, the impedance control output can be in a variety of different formats.

Next, the impedance control output is retrieved from the impedance controller circuit located on the integrated chip semiconductor device. In preferred embodiments of the present invention, this is accomplished using the test enable input to serially shift the binary code from counter 16, through output 52 and electrical access point 54, to off-chip data storage and retrieval device 14. However, in other embodiments, a variety of known methods of retrieving data from an integrated chip device can be employed. Finally, the relative strength of the semiconductor fabrication process used to fabricate the integrated chip semiconductor device is determined based upon the value of the impedance control output. When appropriate, the above-described method is employed using both an N-channel-type impedance controller circuit and a P-channel-type impedance controller circuit to determine the relative strength of both the N-channel and P-channel processes. Using this information, devices having an optimized combination of N-channel strength and P-channel strength can be selected. Further, based upon the distribution of a large number of tested devices, the N-channel and P-channel processes can be optimized or improved.

Although the present invention has been described with reference to preferred embodiments, workers skilled in the art will recognize that changes may be made in form and detail without departing from the spirit and scope of the invention. For example, the term "coupled to" is intended to include electrical connections through one or more additional components.

What is claimed is:

1. A method of determining a relative strength of a semiconductor fabrication process used to fabricate a semiconductor device, the method comprising:

retrieving an impedance control output from an impedance controller circuit located on the semiconductor device, the impedance controller circuit being of the type which provides the impedance control output to drivers on the semiconductor device to correct for changes in at least one of the following: (1) the semiconductor fabrication process used to fabricate the semiconductor device, (2) an operating voltage and (3) an operating temperature; and determining the relative strength of the semiconductor fabrication process used to fabricate the semiconductor device as a function of a value of the impedance control output.

2. The method of claim 1, and prior to the step of retrieving the impedance control output, further comprising the step:

generating the impedance control output using the impedance controller circuit located on the semiconductor device while the operating voltage and operating temperature are maintained at predetermined levels.

3. The method of claim 1, wherein the impedance controller circuit is of the type which provides a binary code to drivers on the semiconductor device to correct for changes in at least one of the following: (1) the semiconductor fabrication process used to fabricate the semiconductor device, (2) the operating voltage and (3) the operating temperature, wherein the step of retrieving the impedance control output further comprises retrieving the binary code from the impedance controller circuit located on the semiconductor device, the binary code being indicative of the relative strength of the semiconductor fabrication process used to fabricate the semiconductor device.

4. The method of claim 3, wherein the step of retrieving the impedance control output further comprises serially transmitting the binary code from the impedance controller circuit to a location off of the semiconductor device.

5. A process monitor for determining a relative strength of a semiconductor fabrication process used to fabricate an integrated chip, the process monitor comprising:

impedance control means located on the integrated chip for providing an impedance control output which is supplied to input/output drivers on the integrated chip to correct impedances of the input/output drivers for changes in at least one of the following: (1) the semiconductor fabrication process, (2) an operating voltage and (3) an operating temperature, wherein for a particular operating voltage and operating temperature the impedance control output is indicative of the relative strength of the semiconductor fabrication process used to fabricate the integrated chip; and means for accessing the impedance control output from the impedance control means from a location off of the integrated chip to thereby determine the relative strength of the semiconductor fabrication process used to fabricate the integrated chip.

6. The process monitor of claim 5, wherein the impedance control means further comprises:

means for generating the impedance control output; and a buffer having a buffer input and a buffer output, wherein the buffer input is coupled to the impedance control output and wherein an impedance of the buffer output is controlled as a function of a value of the impedance control output.

7. The process monitor of claim 6, wherein the buffer output is coupled to a reference impedance located off of the integrated chip, and wherein the means for generating the impedance control output generates the impedance control output such that the impedance of the buffer output is substantially equal to the reference impedance.

8. The process monitor of claim 7, wherein the means for generating the impedance control output comprises:

counter means for providing the impedance control output in the form of a binary code, the counter means having a clock signal input for receiving a clock signal, the counter means also having output lines coupled to the buffer input for providing the impedance control output in the form of the binary code to the buffer, wherein the impedance control output binary code is adjusted by the counter means during clock cycles; and means for controlling the clock signal such that, upon the impedance of the buffer output becoming substantially equal to the reference impedance, the impedance control output binary code is maintained at a substantially constant value.

9. The method of claim 8, wherein the means for accessing the impedance control output from the impedance control means comprises:

a process monitor output line on the counter means; and an electrical access point coupled to the process monitor output line and providing electrical access to the process monitor output line from the location off of the integrated chip, wherein the impedance control output in the form of the binary code is serially transmitted from the counter means on the process monitor output line to the location off of the integrated chip.

10. The method of claim 8, wherein a smaller value of the binary code is generally indicative of a stronger relative strength of the semiconductor fabrication process used to fabricate the integrated chip, while a larger value of the binary code is generally indicative of a weaker relative strength of the semiconductor fabrication process used to fabricate the integrated chip.

11. A process monitor for monitoring an outcome of a semiconductor fabrication process used to fabricate a semiconductor device, the process monitor comprising:

an impedance controller circuit located on the semiconductor device, the impedance controller circuit being of a type which generates a binary code used to correct impedances of drivers on the semiconductor device for changes in at least one of the following: (1) the semiconductor process used to fabricate the semiconductor device, (2) an operating voltage and (3) an operating temperature; and an electrical access point coupled to the impedance controller and providing electrical access to the binary code generated by the impedance controller from a location off of the semiconductor device, wherein the binary code generated by the impedance controller for correcting impedances of drivers on the semiconductor device is indicative of a relative strength of the semiconductor fabrication process used to fabricate the semiconductor device.

12. The process monitor of claim 11, wherein the impedance controller circuit comprises:

a counter which provides the binary code at counter output lines, the counter having a first clock signal input for receiving a first clock signal, wherein the binary code is adjusted by the counter during clock cycles of the first clock signal;

a buffer having buffer input lines and a buffer output, wherein the buffer input lines are coupled to the counter output lines and wherein an impedance of the buffer output is controlled as a function of a value of the binary code;

a feedback circuit coupled to the buffer output and to the first clock signal input of the counter, the feedback circuit providing the first clock signal to the counter, wherein the feedback circuit controls the first clock signal such that when the impedance of the buffer output becomes substantially equal to a desired impedance the corresponding binary code is maintained at a substantially constant value.

13. The process monitor of claim 12 and further comprising a reference impedance located off of the semiconductor device and being coupled to the buffer output, wherein the reference impedance is substantially equal to the desired impedance.

14. The process monitor of claim 13, wherein the reference impedance is coupled between a first supply voltage and the buffer output such that a buffer output voltage is determined by a voltage division between the impedance of the buffer output and the reference impedance, and wherein the feedback circuit comprises:

a logical AND gate having an AND gate output and first and second AND gate inputs, the AND gate output being coupled to the first clock signal input of the counter for controllably supplying the first clock signal to the counter, the first AND gate input being coupled to a second clock signal;

a differential amplifier having first and second differential amplifier inputs and a differential amplifier output, the differential amplifier output being coupled to the second AND gate input, the first differential amplifier input being coupled to a reference voltage, the second differential amplifier input being coupled to the buffer output and thereby to the buffer output voltage, wherein the differential amplifier output is maintained at a high logic level as long as the impedance of the buffer output is greater than the desired impedance such that the first clock signal at the AND gate output will be substantially equivalent to the second clock signal at the first AND gate input to thereby cause the counter to adjust the binary code while the impedance of the buffer output is greater than the desired impedance.

15. The process monitor of claim 12, wherein the electrical access point is coupled to a serial output of the counter, thus providing electrical access from a location off of the semiconductor device to the binary code generated by the counter.

* * * * *